(12) United States Patent
Kayama

(10) Patent No.: US 6,879,375 B1
(45) Date of Patent: Apr. 12, 2005

(54) EXPOSURE APPARATUS AND METHOD THAT EXPOSES A PATTERN ONTO A SUBSTRATE

(75) Inventor: Yasunaga Kayama, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/713,215

(22) Filed: Nov. 16, 2000

(30) Foreign Application Priority Data

Nov. 19, 1999 (JP) ............................................ 11-330700

(51) Int. Cl.[7] ........................ G03B 27/42; G03B 27/52; G03B 27/32; F16M 13/00; G01B 11/00
(52) U.S. Cl. ............................ 355/53; 355/55; 355/77; 248/550; 356/401
(58) Field of Search ............................. 355/53, 55, 72, 355/77; 248/550, 638; 356/399, 400, 401; 318/687

(56) References Cited

U.S. PATENT DOCUMENTS

| 5,172,160 | A | | 12/1992 | Van Eijk et al. |
| 5,473,410 | A | | 12/1995 | Nishi |
| 5,528,118 | A | | 6/1996 | Lee |
| 5,623,853 | A | | 4/1997 | Novak et al. |
| 5,781,277 | A | | 7/1998 | Iwamoto |
| 5,959,427 | A | * | 9/1999 | Watson ......................... 318/560 |
| 6,008,885 | A | * | 12/1999 | Takahashi et al. ............ 355/67 |
| 6,036,162 | A | * | 3/2000 | Hayashi ....................... 248/550 |
| 6,359,688 | B2 | * | 3/2002 | Akimoto et al. ............. 250/548 |
| 6,522,388 | B1 | | 2/2003 | Takahashi et al. |

FOREIGN PATENT DOCUMENTS

EP    0 866 374 A2    9/1998

* cited by examiner

*Primary Examiner*—Peter B. Kim
(74) *Attorney, Agent, or Firm*—Oliff & Berridge PLC

(57) ABSTRACT

An exposure apparatus that exposes a pattern of a mask onto a substrate is provided with a projection system that projects the pattern onto a substrate, a holder that holds the projection system, a detector that detects information concerning displacement (e.g., oscillation) of the projection system, an actuator that is arranged in the holder, and a driver that drives the actuator corresponding to the detection results of the detector. Therefore, when, for example, displacement caused by vibration is generated in the holder of the projection system, the detector detects information concerning this displacement and outputs this information to the driver. By driving the actuator with the driver, the actuator controls displacement generated in the holder by canceling the detected displacement. This improves positioning accuracy and pattern projection accuracy of the exposure apparatus by controlling displacement caused by oscillation generated in the projection system.

57 Claims, 5 Drawing Sheets

US 6,879,375 B1

EXPOSURE APPARATUS AND METHOD THAT EXPOSES A PATTERN ONTO A SUBSTRATE

The disclosure of the following priority application is herein incorporated by reference in its entirety: Japanese Patent Application No. 11-330700 filed Nov. 19, 1999.

BACKGROUND OF THE INVENTION

1. Field of the Invention

This invention relates to exposure apparatus and method used for fabricating semiconductor devices or the like, for example, to exposure apparatus and method that expose a pattern of a mask onto a substrate such as a wafer or the like, and particularly to exposure apparatus having an actuator to perform oscillation control.

2. Description of Related Art

Conventionally, in a lithography process, which is one of the methods of fabricating a semiconductor device, various exposure apparatus are used to transfer a circuit pattern formed on a mask or a reticle (hereafter referred to as a reticle) onto a substrate such as a wafer, a glass plate, or the like, coated with a resist (e.g., a photosensitive agent). For example, as an exposure apparatus for a semiconductor device, in response to making a minimum line width of a pattern more fine in order to improve the degree of integration of an integrated circuit, in recent years, a reduction projection exposure apparatus is mainly used to reduce and transfer a reticle pattern onto a wafer by using a projection optical system.

It is known to use a step-and-repeat type projection exposure apparatus or a step-and-scan type projection exposure apparatus as this reduction projection exposure apparatus. The step-and-repeat type reduction projection exposure apparatus (a so-called stepper) sequentially transfers a reticle pattern onto a plurality of shot regions (exposure regions) on a wafer while maintaining the reticle and wafer stationary. The step-and-scan type scanning exposure apparatus (a so-called scanning-stepper) transfers a reticle pattern onto respective shot regions on a wafer by synchronously moving a reticle and a wafer during pattern transfer. See, e.g., Japanese Laid-Open Patent Application No. 8-166043 (corresponding to U.S. patent application Ser. No. 08/539,080, filed Oct. 4, 1995).

In these exposure apparatus, in order to respond to the above-described fine pattern, positioning with high accuracy is necessary in addition to improvement of resolution. Because of this, alignment with high accuracy for a mask, a wafer, or the like, improvement of a servo system positioning capability for a mask stage, a wafer stage, or the like, improvement of vibration isolation from the surrounding environment, and the like is performed. For example, with respect to vibration transmitted through a floor or foundation, a base plate is first provided, which acts as a reference, on the floor. Most vibration can be controlled by using a main body column to support a reticle stage, a wafer stage, a projection optical system (projection lens), and the like, and then mounting the main body column to the base plate via damping units, which shield the components supported by the main body column from floor vibrations.

However, the following problems exist in the conventional exposure apparatus described above.

As the demand for positioning accuracy increases, it is important to control vibration caused by movements of components within the exposure apparatus. That is, the above-mentioned exposure apparatus sequentially repeats exposure for subsequent shot regions after the exposure for one shot region on the wafer is performed, such that a reaction force due to acceleration and deceleration of the wafer stage (in the case of a stepper) or the reticle stage and the wafer stage (in the case of a scanning-stepper) causes oscillation of the main body column and the attached projection optical system. This may cause the projection optical system to be displaced.

In this case, if a relative positioning error between a projection optical system and a wafer or the like is generated, a pattern is transferred to a position different from a desired position on the wafer. This causes positioning error and image blur (i.e., an undesired increase in the pattern line width). In particular, when there is a thin part or a hole in a portion of the projection optical system, as the oscillation frequency decreases and the oscillation amplitude becomes large, displacement of the projection optical system becomes large, and it is difficult to make a pattern fine.

SUMMARY OF THE INVENTION

This invention reflects on the above-mentioned problems. It is one object of this invention to provide an exposure apparatus that improves positioning accuracy and pattern projection accuracy by controlling displacement caused by oscillation generated in a projection system.

In order to accomplish the above and/or other objects, according to one aspect of the invention, an exposure apparatus that exposes a pattern of a mask onto a substrate is provided with a projection system to project the pattern onto a substrate, a holder connected to the projection system to hold the projection system, a detector to detect information concerning displacement of the projection system, an actuator that is arranged on the holder, and a driver that drives the actuator corresponding to the detection results of the detector.

Therefore, in the exposure apparatus of this aspect of the invention, for example, when displacement caused by vibration is generated in the holder of the projection system prior to exposing a pattern of a mask onto a substrate, the detector detects information concerning this displacement and outputs this information to the driver. Furthermore, by driving the actuator with the driver, the actuator controls displacement generated in the holder by canceling the detected displacement. Additionally, it is preferable that the actuator is located in a position where there is a large displacement of the holder. Furthermore, it is preferable that the detector be positioned at a location where there is large oscillation of the projection system.

Other aspects of the invention pertain to a method of making such an exposure apparatus and to a method of using such an apparatus.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENT(S)

Exposure apparatus according to embodiments of this invention will now be explained with reference to the figures. For illustrative purposes, an exposure apparatus that is a so-called scanning-stepper is explained in which a reticle and a wafer are synchronously moved while a circuit pattern of a semiconductor device formed in the reticle is transferred onto a wafer.

Figure 1:
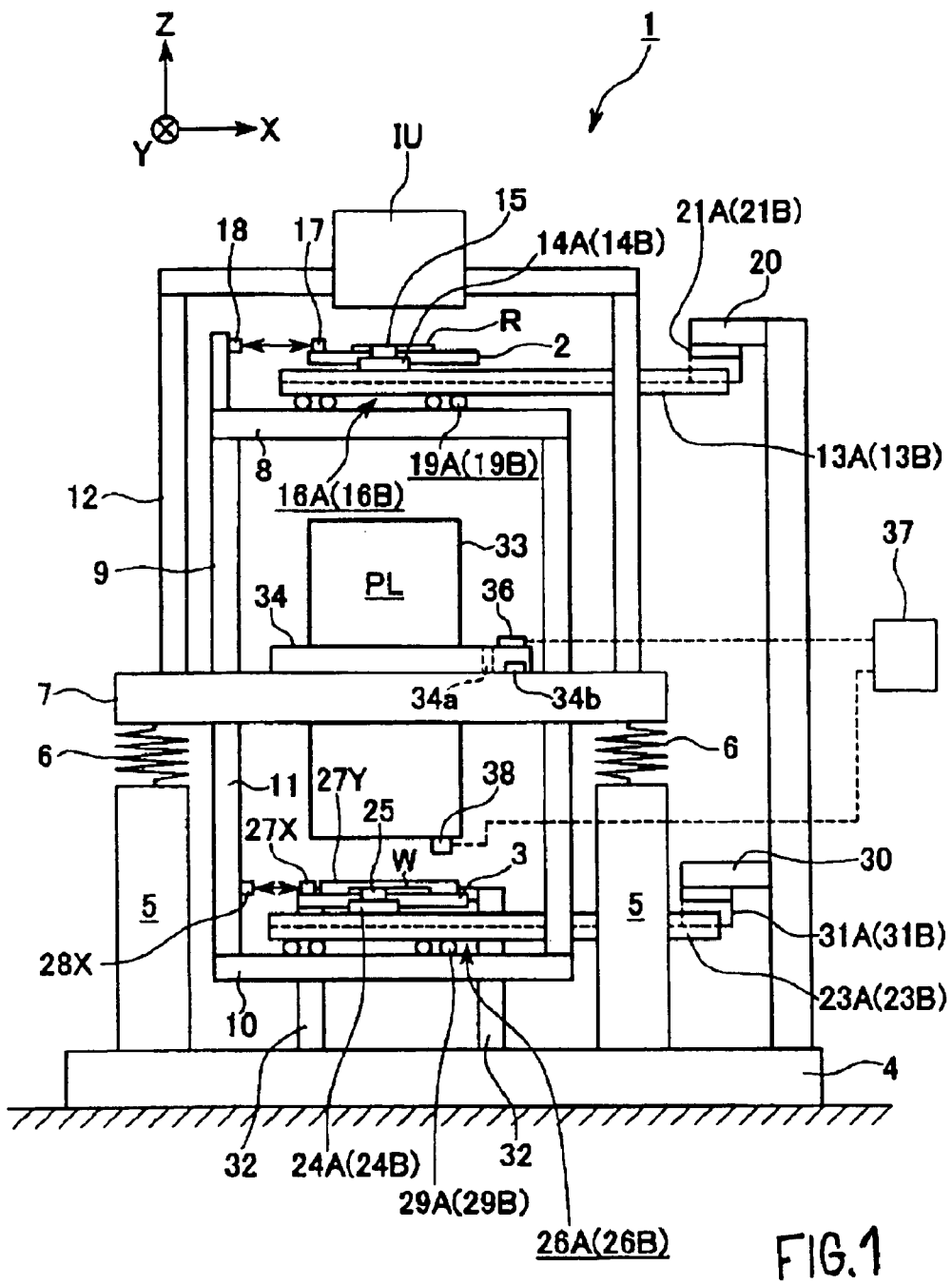
FIG. 1 is a diagram showing a first embodiment of this invention, and is a schematic structural diagram of an exposure apparatus in which an acceleration sensor, piezoelectric elements, and a driving device (driver) are arranged.

An exposure apparatus 1 shown schematically in FIG. 1 is constituted by an illumination system IU, a reticle stage 2, a projection optical system PL and a wafer stage 3. The illumination optical system IU irradiates a rectangular-shaped or an arc-shaped (generically referred to as slit-shaped) illumination region onto a reticle (mask) R at a uniform illumination using exposure illumination light supplied from a light source (not depicted). The reticle stage 2 functions as a mask stage, and holds the reticle R. The projection optical system PL projects illumination light output from the reticle R onto the wafer (substrate) W. The wafer stage 3 functions as a substrate stage, and holds the wafer W. Furthermore, the optical axis direction of the projection optical system PL is a Z direction, a synchronous movement direction of the reticle R and the wafer W in a direction perpendicular to this Z direction is an X direction, and a non-synchronous movement direction is a Y direction.

In the exposure apparatus 1, three columns 5 are fixed on a flat base plate 4. A vibration isolator 6, constituted by an elastic spring and an air damper or an oil damper, are fixed on each of the three columns 5 (i.e., there are three vibration isolators 6). The resulting structure is not affected by external vibrations. A lens barrel holding plate 7 is mounted on the columns 5 via the vibration isolators 6. The above-mentioned projection optical system PL is supported (held) by being inserted from an upper direction into the lens barrel holding plate 7 such that its optical axis direction is a Z direction. A reticle holding plate 8 on which the reticle stage 2 is mounted is supported by a frame 9 arranged on the lens barrel holding plate 7. A wafer holding plate 10 on which the wafer stage 3 is mounted is suspended from the lens barrel holding plate 7 via a frame 11.

The illumination optical system IU is supported by a frame 12 arranged on the lens barrel holding plate 7. Furthermore, as exposure illumination light, for example, bright light beams (g- or i-light beans) emitted from an extra-high pressure mercury lamp, far ultraviolet radiation light beams (DUV) such as a KrF excimer laser light beam (wavelength of 248 nm) or the like, a vacuum ultraviolet ray (VUV) such as an ArF excimer laser light beam (wavelength of 193 nm) and an $F_2$ laser light beam (wavelength of 157 nm) or the like can be used.

An X-axis linear motor 16A having a stationary part 13A and a movable part 14A is arranged on the reticle holding plate 8. The movable part 14A is connected to the reticle stage 2 via a connecting member 15. The reticle stage 2 is guided by a direct-acting guide (not depicted) in the X-axis direction, as it is driven by the X-axis linear motor 16A, and thus moves smoothly back-and-forth in the X direction. Furthermore, the above-mentioned X-axis linear motor 16A is arranged on one side (relative to the Y direction) of the reticle stage, and a second X-axis linear motor 16B having a stationary part 13B and a movable part 14B is arranged on the other side of the reticle stage 2. These X-axis linear motors 16A and 16B drive the reticle stage 2 in the X direction by a moving coil method. That is, the movable parts 14A and 14B are coils fixed to the stage 2, whereas the stationary parts 13A and 13B are magnet systems; Lorentz forces are generated between the coils and magnet systems to drive the stage 2. However, the movable parts could include the magnets, and the stationary parts could include the coils.

The position of the reticle stage 2 in the X direction is detected by a moving mirror 17 fixed on the reticle stage 2 and by a laser interferometer 18 that irradiates a laser beam parallel to the X axis onto the moving mirror 17. The laser interferometer 18 is supported by the reticle holding plate 8.

The stationary parts 13A and 13B are slidable back and forth in the X direction while being guided by the direct-acting guides 19A and 19B. A damping (or reaction) frame 20 fixed to the base plate 4 has X damping members 21A and 21B that give a damping (or compensatory) force to the stationary parts 13A and 13B without physically contacting parts 13A and 13B.

An X-axis linear motor 26A having a stationary part 23A and a movable part 24A is arranged on the wafer holding plate 10. The movable part 24A is connected to the wafer stage 3 via a connecting member 25. The wafer stage 3 is guided by a direct-acting guide (not depicted) in the X-axis direction, as it is driven by the X-axis linear motor 26A, and thus moves smoothly back-and-forth in the X direction. Additionally, the X-axis linear motor 26A is arranged on one side (relative to the Y direction) of the wafer stage 3, and a second X-axis linear motor 26B having a stationary part 23B and a movable part 24B is arranged on the other side of the wafer stage 3. These X-axis linear motors 26A and 26B drive the wafer stage 3 in the X direction by the moving coil method described above.

The stationary parts 23A and 23B are slidable back and forth in the X direction while being guided by direct-acting guides 29A and 29B. Furthermore, a damping frame 30 fixed to the base plate 4 has X damping members 31A and 311B that give a damping force to the stationary parts 23A and 23B in an X direction without physically contacting parts 23A and 23B.

Although not depicted, a Y-axis linear motor is arranged on the wafer stage 3, and uses a 2-axis moving magnet method to drive the wafer stage 3 in the Y direction. The wafer stage 3 floatingly travels in an XY plane on the wafer holding plate 10 by an air bearing method such that stage 3 does not physically contact wafer holding plate 10. Furthermore, a Y damping member (not depicted) which gives a damping force to a stationary part of a Y-axis linear motor (not depicted) in the Y direction (without contact) is fixed to a damping frame 32 that is fixed in the +Y direction of the base plate 4.

The position of the wafer stage 3 in the X direction is detected by a moving mirror 27x that is fixed on the wafer stage 3 and extends in the Y direction, and by a laser interferometer 28x that irradiates a laser beam parallel to the X axis onto the moving mirror 27x. The laser interferometer 28x is supported by the wafer holding plate 10. Additionally, the position of the wafer stage 3 in the Y direction is detected by a moving mirror 27Y that is fixed on the wafer stage 3 and extends in the X direction, and by a laser interferometer (not depicted) that irradiates a laser beam parallel to the Y axis onto the moving mirror 27Y.

The projection optical system PL is a two-side telecentric system. That is, projection optical system PL is telecentric on an object surface (reticle R) side and on an image surface (wafer W) side. Projection optical system PL also has a round projection field, and uses a dioptric system of ¼ (or ⅕) reduction magnification constituted by a dioptric element (a refractive lens element) in which quartz and fluorite are used as an optical material. Because of this, when illumination light is irradiated onto the reticle R, in the circuit pattern on the reticle R, an imaging light beam from the part that has been illuminated by the illumination light is incident to the projection optical system PL. This incident light is of a partial image of the circuit pattern, limited to the slit shape of the illumination light, which extends across the center of the round field of the object surface side of the projection optical system PL. Thus, the projection optical system PL projects an inverted partial image of the circuit pattern, which is reduced in size and transferred to a resist layer of one shot region surface among a plurality of shot regions on the wafer W, arranged on the image surface side of the projection optical system PL.

Figure 2:
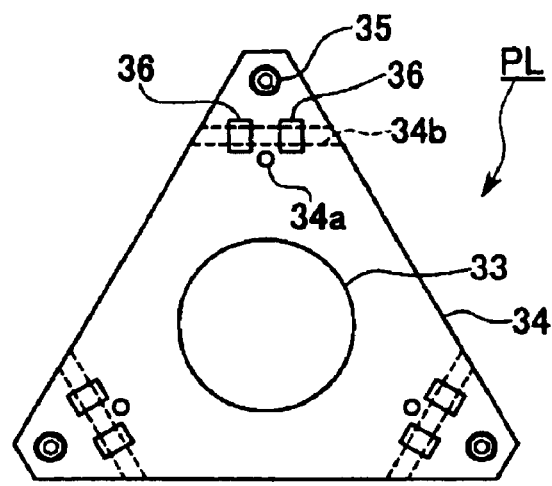
FIG. 2 is a plan view of a flange and a projection optical system that are part of the FIG. 1 exposure apparatus.

The projection optical system PL has a lens barrel 33 that holds a plurality of optical elements (projection lenses) inside thereof. A flange (a holder) 34, for holding the lens barrel 33 along the Z direction on the lens barrel holding plate 7, is integral with and protrudes from the peripheral surface of the lens barrel 33. As shown in FIG. 2, the flange 34 has a substantially triangular shape seen from a plan view and is fixed to the lens barrel holding plate 7 by supports 35 such as, e.g., fixing screws or the like in its respective corners. In the flange 34, precisely processed parts—through holes 34a and notches 34b—are formed between the lens barrel 33 and the respective supports 35. Each of the notches 34b is formed in the surface of the flange 34 that faces the lens barrel holding plate 7 and extends in a direction that is perpendicular to a line connecting its support 35 with the lens barrel 33 (see FIG. 2).

Preferably the flange 34 is made from a material with a low rate of heat expansion, such as Inver (an alloy having low expansion constituted by iron including 36% of nickel, 0.25% of magnesium, a small amount of carbon, and other elements). Flange 34 forms a so-called kinematic support mount that supports the projection optical system PL via a point, a surface, and a V groove to the lens barrel holding plate 7. If this type of kinematic support structure is used, there is an advantage that assembly of the projection optical system PL to the lens barrel holding plate 7 is easily performed, and misalignment due to vibration, temperature change, or the like after assembly can be most effectively reduced.

In the respective corners of the flange 34, a plurality of piezoelectric elements 36 (two piezoelectric elements in FIG. 2), which function as an actuator, are attached along the notches 34b by a connector such as adhesive in the vicinity of the through holes 34a and the notches 34b, which is a place where the integrity (strength) of the flange 34 is weak (i.e., due to the hole 34a and notches 34b). The piezoelectric elements 36 can be contracted and expanded in the X and Y directions by applying a predetermined electric current thereto. The piezoelectric elements 36 are connected to a driving device (a driver) 37 that drives the piezoelectric elements 36 as shown in FIG. 1.

An acceleration sensor 38 is provided under the lens barrel 33, which is a location where inclination vibration of the projection optical system PL is the largest. Sensor 38 functions as a detection device that detects information concerning displacement of the projection optical system PL. The detection result of the acceleration sensor 38 is output to the driving device 37.

Figure 3:
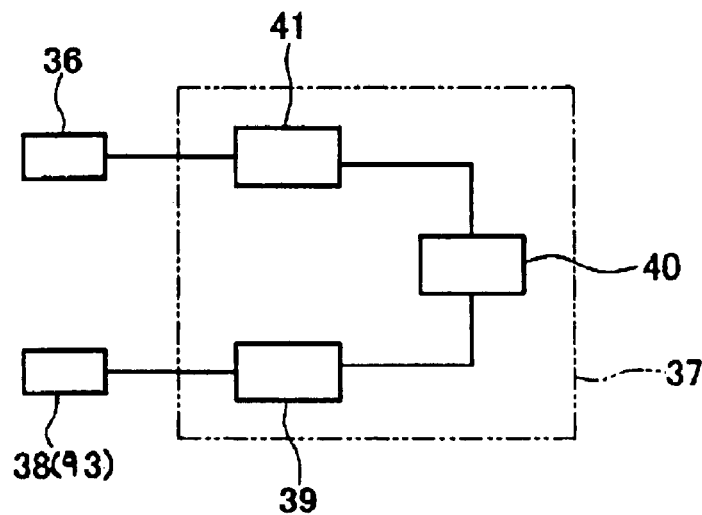
FIG. 3 is a block diagram of a driver.

As shown in FIG. 3, the driving device 37 is schematically structured by a filter 39, a signal converter 40, and an amplifier 41. The filter 39 performs a predetermined filtering (extraction) of the acceleration signal output from the acceleration sensor 38 and outputs this signal to the signal converter 40. The signal converter 40 converts the extracted signal from the filter 39 into a predetermined shape, and outputs the shaped signal to the amplifier 41. The amplifier 41 outputs the signal converted by the signal converter 40 to the piezoelectric elements 36 by amplifying it with a predetermined gain.

The following explains an operation of the reticle stage 2 of the exposure apparatus having the above-mentioned structure.

In order to drive the reticle stage 2 in the +X direction, when a driving force in the +X direction is applied to the movable parts 14A and 14B, as the reticle stage 2 moves, an equal and opposite (−X direction) reaction force is generated in the corresponding stationary parts 13A and 13B. Simultaneously, a thrust in the X direction, which has a magnitude the same as the reaction force, but is in a reverse direction (i.e., the +X direction) and that functions as a damping (or compensatory) force with respect to the stationary parts 13A and 13B is applied by the X damping members 21A and 21B, so there will be no net force applied to the stationary parts 13A and 13D in the X direction. Accordingly, the stationary parts 13A and 13B are maintained motionless. At this time, the reaction force and the damping (or compensatory) force are applied substantially on the same straight line, so no moment is generated. Therefore, no vibration or the like is generated during the accelerating period of the movable parts 14A and 14B. Therefore, the reticle R can be driven to a desired position in the X direction with high accuracy.

In the same manner, when the wafer stage 3 is driven in the X direction, a force due to acceleration (or deceleration) is applied to the movable parts 24A and 24B of the corresponding X-axis linear motors 26A and 26B, and the wafer stage 3 is driven in the X direction. At this time, a reaction force having the same magnitude in the opposite direction is applied to the corresponding stationary parts 23A and 23B. Further, a damping (or compensatory) force is applied to the stationary parts 23A and 23B by the X damping members 31A and 31B. The damping force has the same magnitude as the reaction force, and is applied in the opposite direction. Thus, the stationary parts 23A and 23B are maintained motionless.

Furthermore, when the wafer stage 3 is driven in the Y direction, a thrust proportional to the predetermined acceleration is applied by the Y-axis linear motor. Accordingly, in order to compensate for a reaction force that is applied to the stationary part of the Y-axis linear motor, a damping (or compensatory) force in the Y direction, which has the same magnitude as the reaction force in an opposite direction, is applied by the Y damping member, so that no net force in the Y direction is applied to the stationary part, and therefore the stationary part can be maintained motionless.

When exposure is completed for one shot region on the wafer W, the wafer stage 3 is driven by the X-axis linear motors 26A and 26B and the Y-axis linear motor to step (move) the wafer so that the next shot region is moved to the scanning start position. The X-axis linear motors 26A and 26B are then driven at a predetermined speed, and the reticle stage 2 is driven so as to be synchronized with the wafer stage 3. The reticle R and the wafer W are thus synchronously scanned in the X direction with respect to the projection optical system PL at a speed ratio that is defined by the projection magnification, to repeat the step-and-scan exposure on the next shot region. This process is performed on each of the respective shot regions on the wafer W.

As described above, when the reticle stage 2 and the wafer stage 3 are moved, the stationary parts of the respective stages are maintained motionless. However, mechanical inclination resonance exists in the structure that maintains the projection optical system PL fixed to the lens barrel holding plate 7 via the flange 34, and this resonance varies depending on the material rigidity and shape of the flange 34. Furthermore, although holding the flange 34 by three supports prevents distortion of the projection optical system PL from being generated, the mechanical inclination resonance caused by that three-support structure is exasperated because the length of the projection optical system PL in the Z direction is long. In particular, like the flange 34 in this embodiment, when a thin part such as the through holes 34a and/or the notches 34b exists, resonance frequency decreases and oscillation amplitude becomes large. Oscillation amplitude at a given resonance frequency depends on the shape or the like, but distortion (i.e., bending) and contraction/expansion (which causes lateral displacement) occur at a position where the strength of the flange is weak, i.e., in the vicinity of the above-mentioned holes and notches. Because of this, in this embodiment, displacement generated in the projection optical system PL due to the above-mentioned distortion and contraction/expansion are controlled by the acceleration sensor 38, the piezoelectric elements 36, and the driving device 37.

Specifically, oscillation that occurs during the operation of the reticle stage 2 and the wafer stage 3 is transmitted to the lens barrel holding plate 7 via the frames 9 and 11. This causes the projection optical system PL to be minutely oscillated, which causes the above-described distortion and contraction/expansion of the flange 34. The acceleration sensor 38 detects this slight oscillation and provides an output indicative thereof to the filter 39 of the driving device 37. At this time, the acceleration sensor 38 is arranged at the lower end of the lens barrel 33, so oscillation generated in the projection optical system PL can be effectively and accurately detected. (This is because, as explained above, displacement due to oscillation is at a maximum at the ends of the projection optical system PL.)

The filter 39 functions to extract acceleration due only to oscillation caused by mechanical resonance of the projection optical system PL, and provides a signal indicative thereof to the signal converter 40. The signal converter 40 converts the input acceleration signal to a speed signal, creates a signal that drives the piezoelectric elements 36, and supplies this signal to the amplifier 41. The amplifier 41 amplifies the input speed signal and provides this amplified speed signal to the piezoelectric elements 36. The piezoelectric elements 36 are expanded or contracted in a direction that cancels the distortion and contraction/expansion generated in the flange 34 at a rate that is proportional to the rate at which the flange 34 contracts/expands. By this operation, distortion and contraction/expansion generated in the flange 34 can be controlled, and oscillation amplitude of the projection optical system PL can be made very small. The structures of the sensors, filter, signal converter and piezoelectric elements are conventional, and therefore are not further explained.

As explained above, in the exposure apparatus of this embodiment, oscillation due to the structure of the projection optical system PL is detected by the acceleration sensor 38, the piezoelectric elements 36 are contracted and expanded based on the result of this detection, a force that cancels distortion and contraction/expansion of the flange 34 is applied, and oscillation of the projection optical system PL due to this distortion and contraction/expansion can be damped. Accordingly, deterioration of the positioning accuracy and pattern projection accuracy due to oscillation of the projection optical system PL can be prevented, and exposure accuracy corresponding to a fine pattern can be maintained. Furthermore, in this embodiment, when oscillation of the projection optical system PL is controlled, only oscillation caused by contraction/expansion of the piezoelectric elements 36 is generated, so any additional oscillation that would occur if the lens barrel 33 was directly driven is not generated in other parts of the exposure apparatus.

Furthermore, in the exposure apparatus of this embodiment, the piezoelectric elements 36 are attached at a place on the flange 34 where resonance frequency decreases and oscillation amplitude becomes large, so distortion and contraction/expansion generated in the flange 34 can be effectively controlled, the piezoelectric elements 36 can be made small, and the number of piezoelectric elements 36 can be minimized.

Figure 4:
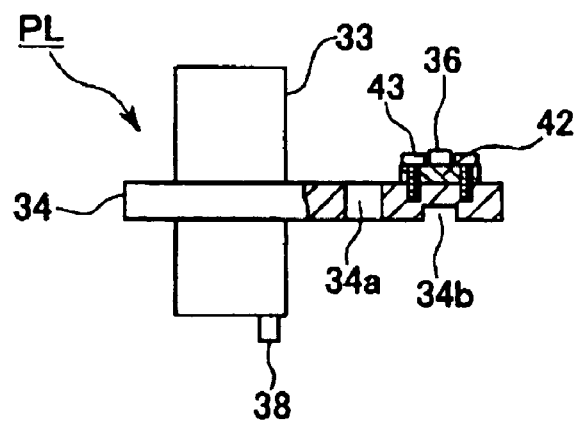
FIG. 4 is a diagram showing a second embodiment of this invention, and is a front cross-sectional view in which an adapter plate in which piezoelectric elements are attached is detachably fixed to a flange by fixing screws.

FIG. 4 is a diagram showing a second embodiment of an exposure apparatus according to the invention. In this diagram, elements that are the same as the elements of the first embodiment shown in FIGS. 1–3 are identified by the same symbols, and their explanation is omitted. The difference between the first and second embodiments is the way in which the piezoelectric elements 36 are attached. Furthermore, only the projection optical system PL is shown in FIG. 4.

As shown in FIG. 4, on the surface of the flange 34 in the vicinity of the through holes 34a and the notches 34b, an adapter plate 42 is detachably fixed to flange 34 along the notch 34b by a fixing screw 43. Furthermore, the piezoelectric elements 36 are attached to the adapter plate 42 by a connector such as adhesive. In this case, the size and the number of the piezoelectric elements 36 are determined by the size of the oscillation amplitude or the like. The remaining structure is the same as in the first embodiment.

In this embodiment, distortion and contraction/expansion of the flange 34 that are generated due to the movement of the reticle stage 2 and the wafer stage 3 are transmitted to the adapter plate 42 such that distortion and contraction/expansion also are generated in the adapter plate 42. The distortion and contraction/expansion generated in the adapter plate 42 can be controlled as the piezoelectric elements 36 are expanded and contracted. In addition to obtaining the same effects as in the above-described first embodiment, the second embodiment allows for the piezoelectric elements 36 to be replaced easily by replacing the adapter plate 42. Additionally, based upon the size of the flange 34 and the size of the distortion and contraction/expansion generated in the flange 34, different adapter plates 42 having various sizes and numbers of piezoelectric elements 36 can be prepared, and the appropriate adapter plate 42 can be mounted to the flange 34 depending on the situation.

Figure 5:
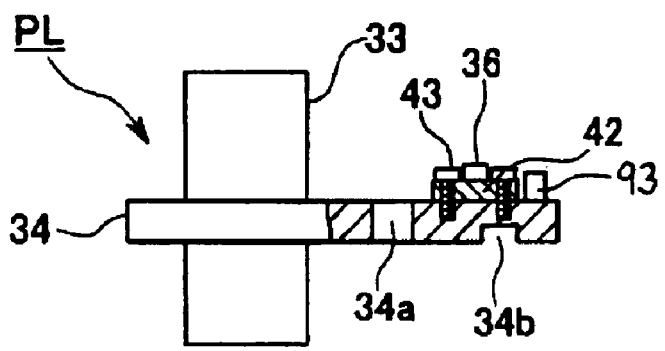
FIG. 5 is a diagram showing a third embodiment of this invention, and is a front cross-sectional view in which piezoelectric elements and a distortion sensor are fixed to a flange.

FIG. 5 is a diagram showing an exposure apparatus according to a third embodiment of the invention. In this diagram, the elements that are the same as the elements of the second embodiment shown in FIG. 4 are identified with the same symbols, and their explanation is omitted. The difference between the third and second embodiments is that a distortion sensor is arranged as a detector.

That is, as shown in FIG. 5, a distortion sensor (detector) 93 is fixed to the flange 34 outside of the adapter plate 42 where the piezoelectric elements 36 are attached. In this embodiment, the distortion sensor 93 detects fine oscillations generated in the projection optical system PL and outputs its detection results to the filter 39 (see FIG. 3). Furthermore, the filter 39 extracts only the distortion caused by mechanical resonance of the projection optical system PL, the signal converter 40 converts the signal supplied by filter 39 into a speed signal, creates a signal for driving the piezoelectric elements 36, and supplies this signal to the amplifier 41. The amplifier 41 amplifies the input speed signal and outputs an amplified speed signal to the piezoelectric elements 36.

The exposure apparatus of this embodiment obtains the same effects as in the second embodiment. In the first embodiment, oscillation of the projection optical system PL can be detected by the acceleration sensor 38, and in the second embodiment, fine oscillation of the projection optical system PL can be detected by the distortion sensor 43. However, it is also possible to provide both the sensors 38 and 43. In this case, depending upon the fixing position of the sensors 38 and 43 or the like, a speed signal is generated based upon the detection results of the sensors 38 and 43.

Figure 6:
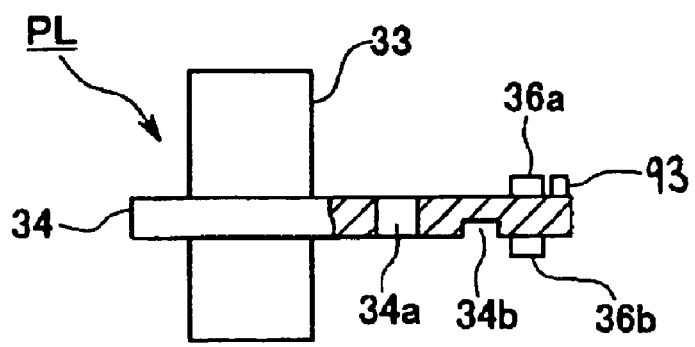
FIG. 6 is a diagram showing a fourth embodiment of this invention, and is a front cross-sectional view in which piezoelectric elements and a distortion sensor are fixed to one surface of a flange and piezoelectric element are fixed to another surface.

FIG. 6 is a diagram showing an exposure apparatus according to a fourth embodiment of the invention. In this diagram, the elements that are same as in the third embodiment shown in FIG. 5 are indicated with the same symbols, and their explanation is omitted. The difference between the fourth and third embodiments is the attachment position of the piezoelectric elements.

That is, as shown in FIG. 6, piezoelectric elements 36*a* and 36*b* are attached at substantially the same position on both the top and bottom surfaces of the flange 34. In general, if distortion and contraction/expansion are generated in the flange 34, expansion is generated in one surface, and contraction is generated in the other surface. Therefore, in this embodiment, the piezoelectric elements 36*a* and 36*b* are simultaneously operated in reverse phases. By this operation, much more force can be applied to the flange 34, and oscillation of the projection optical system PL can be more effectively controlled.

Figure 7:
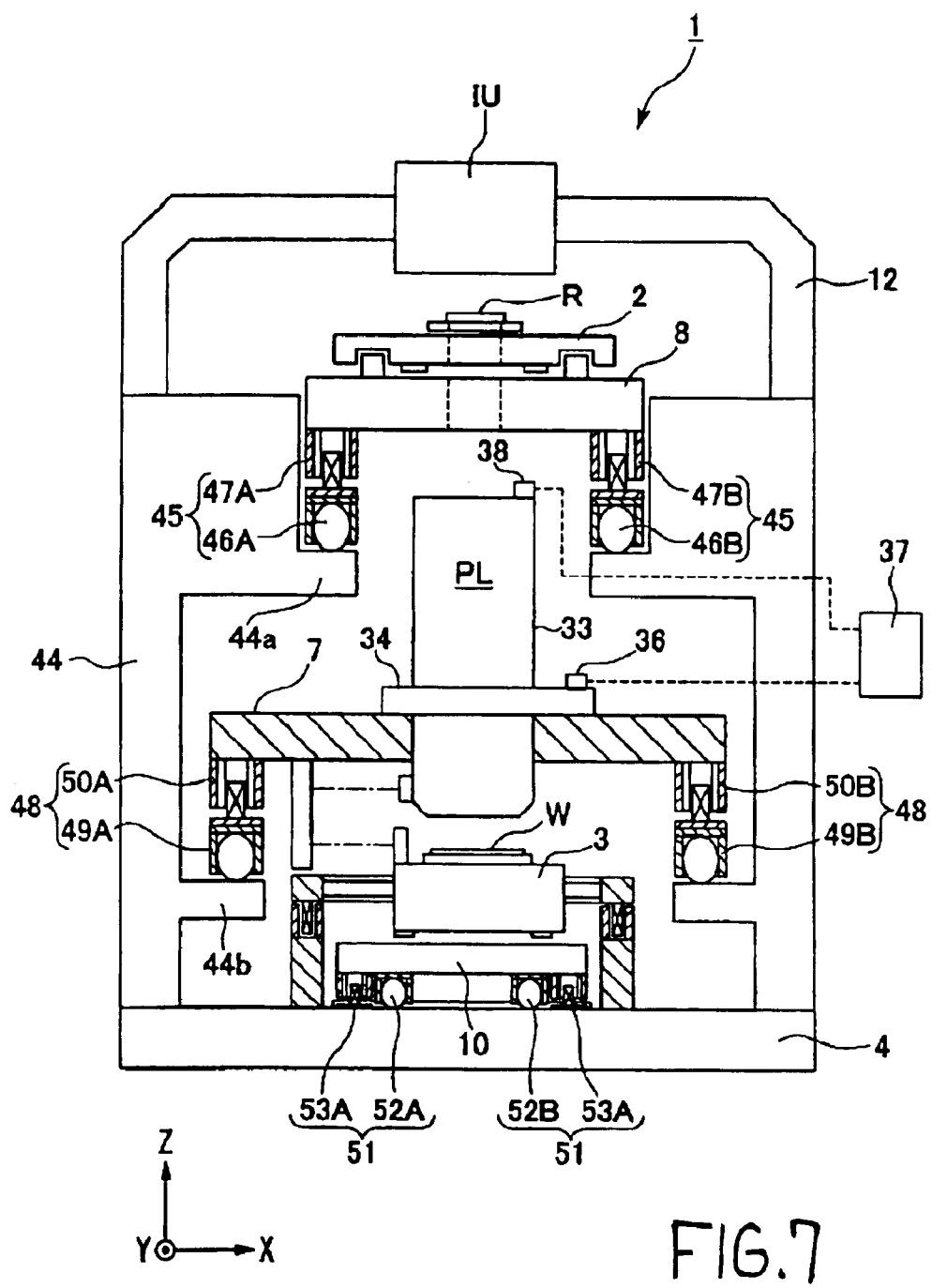
FIG. 7 is a diagram showing a fifth embodiment of this invention, and is a schematic structural diagram of an exposure apparatus in which a reticle stage, a wafer stage, and a projection optical system are oscillatingly independently arranged.

FIG. 7 is a diagram showing an exposure apparatus according to a fifth embodiment of the invention. In this diagram, the elements that are the same as in the first embodiment shown in FIGS. 1–3 are identified with the same symbols, and their explanation is omitted. The difference between the fifth and first embodiments is a support structure of the reticle stage 2, the wafer stage 3, and the projection optical system PL and a fixing position of the acceleration sensor 38.

That is, as shown in FIG. 7, a reaction frame 44 is arranged on base plate 4. An illumination optical system IU is arranged above the reaction frame 44 via a frame 12. Furthermore, in the upper and lower portion sides of the reaction frame 44, step portions 44*a* and 44*b* protrude inwardly, and are vertically separated from each other by an interval.

The reticle holding plate 8 is substantially horizontally supported on the step portion 44*a* of the reaction frame 44 via damping units 45 located in the respective corners of the plate 8 (two additional damping units in two other corners of the square plate 8 are not depicted in FIG. 7). Each damping unit 45 has an air mount (damping pad) 46A–46D (FIG. 7 shows only 46A and 46B in the front side of the exposure apparatus) in which internal pressure can be adjusted, arranged in series with a voice coil motor 47A–47D (FIG. 7 shows only 47A and 47B in the front side) having a stationary part and a movable part, on the step portion 44*a*.

The lens barrel holding plate 7 is substantially horizontally supported on the step portion 44*b* of the reaction frame 44 via damping units 48 located in the respective corners of plate 7 (FIG. 7 does not show two additional damping units located in two other corners of the square plate 7). Each damping unit 48 has an air mount (damping pad) 49A–49D (FIG. 7 shows only 49A and 49B in the front side of the exposure apparatus) in which internal pressure can be adjusted, arranged in series with a voice coil motor 50A–50D (FIG. 7 shows only 50A and 50B in the front side) having a stationary part and a movable part arranged on the step portion 44*b*.

Additionally, the wafer holding plate 10 is substantially horizontally supported on the base plate 4 via damping units 51. The damping units 51 are arranged in the respective corners of the wafer holding plate 10 (FIG. 7 does not show two additional damping units 51 located in two other corners of the square plate 10). Each damping unit 51 has an air mount (damping pad) 52A–52D (FIG. 7 shows only 52A and 52B in the front side) in which internal pressure can be adjusted, and a voice coil motor 53A–53D (FIG. 7 shows only 53A and 53B of the front side) also aligned adjacent to each other on the base plate 4.

Furthermore, also provided on the reticle holding plate 8, the wafer holding plate 10, and the lens barrel holding plate 7, are three oscillation sensors (e.g., accelerometers; not depicted) that measure oscillation in the Z direction of the respective holding plates and three oscillation sensors (e.g., accelerometers; not depicted) that measure oscillation in the XY plane direction. Two of the latter oscillation sensors measure oscillation in the Y direction of the respective holding plate, and the remaining oscillation sensor measures oscillation in the X direction (hereafter, these oscillation sensors are referred to as an oscillation sensor group). Based on the measurement value of the oscillation sensor group, oscillation in six degrees of freedom (X, Y, Z, θX, θY, θZ) of the reticle holding plate 8, the wafer holding plate 10, and the lens barrel holding plate 7 can be respectively obtained.

Furthermore, in this embodiment, the upper portion side of the projection optical system PL (i.e., the portion extending above flange 34) is longer than the lower portion side of the projection optical system PL (i.e., the portion extending below flange 34), and therefore the largest inclination oscillation of the projection optical system PL occurs in the upper end portion. Because of this, the acceleration sensor 38 to detect oscillation of the projection optical system PL is arranged on the top of the lens barrel 33. The remaining structure is the same as in the first embodiment.

In the exposure apparatus 1 having the above-mentioned structure, when the reticle stage 2 moves, based on the measurement value of the laser interferometer, a force (a counter force) that cancels the effect due to the change of the center of gravity caused by the movement of the reticle stage 2 is applied by the damping units 45 using feed-forward control, and the air mounts 46A–46D and the voice coil motors 47A–47D are driven so as to generate this counter force. In the same manner, when the wafer stage 3 moves, based on the measurement value of the laser interferometer, a counter force that cancels the effect due to the change of center of gravity caused by the movement of the wafer stage 3 is applied by the damping units 51 using feed-forward control, and the air mounts 52A–52D and the voice coil motors 53A–53D are driven so as to generate this counter force.

Furthermore, in the lens barrel holding plate 7, even when only a slight oscillation is generated in the reaction frame 44 by the counter force that is applied during the movement of the reticle stage 2 and the wafer stage 3 as described above, based on the measurement value of the oscillation sensor group arranged in the lens barrel holding plate 7, oscillation in six degrees of freedom is obtained, and the air mounts 49A–49D and the voice coil motors 50A–50D can be feedback-controlled, so that the lens barrel holding plate 7 can be maintained at a constantly stable position by canceling this slight oscillation.

The exposure apparatus of this embodiment can obtain the same effect as in the first embodiment. In addition, the projection optical system PL supported by the lens barrel holding plate 7 can be maintained at a stable position, and the reticle stage 2, the wafer stage 3, and the projection optical system PL can have their oscillations independently controlled by the damping units 45, 51 and 48, respectively. Thus, oscillation due to the driving of the reticle stage 2 and the wafer stage 3 can be prevented from being transmitted to the projection optical system PL, generation of shifting and image blurring of a pattern transfer position due to oscillation of the projection optical system PL can be effectively prevented, and exposure accuracy can be improved.

Furthermore, in the above-mentioned embodiment, the piezoelectric elements 36 apply force to the flange 34 proportional to detected speed of oscillation of the flange; but the invention is not limited to this technique. Oscillation also can be controlled by generating a counter force proportional to acceleration. Furthermore, in this embodiment, precisely processed parts such as the through holes 34a and the notches 34b are arranged in the flange 34, but even if these parts do not exist, slight oscillation is generated in the projection optical system PL. Therefore, it is effective that oscillation is detected by the above-mentioned sensors 38 and 43 and that a counter force which cancels distortion and contraction/expansion of the flange 34 is applied by the piezoelectric elements 36. When there is no processed part in the flange 34, distortion and contraction/expansion generated in the flange 34 are more dispersed, and therefore many piezoelectric elements 36 need to be provided or the piezoelectric elements need to be attached in a large area. Thus, by intentionally arranging a processed part(s) in order to concentrate distortion and contraction/expansion, it is possible to reduce the number of piezoelectric elements 36 that are required, and it is possible to make them small.

Additionally, as a sensor that detects displacement of the projection optical system PL, in addition to the acceleration sensor 38 and the distortion sensor 43, a reflection type optical sensor that uses a laser or the like to measure a distance between the projection optical system PL (lens barrel 33) and a reference, a static capacitance type sensor, an ultrasonic sensor, or the like also can be used.

Additionally, the invention is not limited to piezoelectric elements 36 as an actuator; other elements can be used as long as displacement can be added to the flange 34.

Furthermore, the above-mentioned embodiment is structured such that the projection optical system PL is supported by one lens barrel holding plate 7; however, for example, it is also acceptable to support the projection optical system PL by a plurality of (e.g., two) lens barrel holding plates arranged at an interval in the Z direction. In this case, the flange can be made to correspond to each lens barrel holding plate, a plurality of lens barrel holding plates (e.g., two) are arranged, and the piezoelectric elements can be appropriately attached to the respective flanges are controlled in response to distortion and contraction/expansion generated in the respective flanges and inclination of the projection optical system PL supported by the plurality of lens barrel holding plates.

The substrate that is exposed by the exposure apparatus is not limited to a semiconductor wafer W for producing a semiconductor device. The substrate also can be the original version of a reticle (composed of quartz, or a silicon wafer) (i.e., the exposure apparatus can be used to produce reticles), a ceramic wafer for a thin film magnetic head, a glass substrate for producing a liquid crystal display device, or the like.

The exposure apparatus 1 can be a step-and-scan type scanning exposure apparatus (scanning stepper; see e.g., U.S. Pat. No. 5,473,410) in which the reticle R and the wafer W are synchronously scanned while the pattern of the reticle R is exposed onto the wafer, or a step-and-repeat type projection exposure apparatus (stepper) in which a pattern of the reticle R is exposed in a state where the reticle R and the wafer W are stationary.

As noted above, the exposure apparatus 1 can be used to fabricate a semiconductor device, a liquid crystal display element, a thin film magnetic head, an imaging element (CCD), or a reticle, for example.

Additionally, the light source can provide an exposure illumination light having a bright line (g line (436 nm), h line (404.7 nm), i line (365 nm)) generated from an extra-high pressure mercury lamp, or it can be a KrF excimer laser (248 nm), an ArF excimer laser (193 nm), an $F_2$ laser (157 nm), etc. It also can generate a charged particle line such as an X ray or an electron beam. For example, a hot electron radiation type hexalanthanumboride ($LaB_6$) and tantalum (Ta) electron gun can be used to generate an electron beam. Furthermore, when using an electron beam, a pattern can be formed directly on the wafer without using a reticle R. Furthermore, a high frequency laser such as a semiconductor laser, a YAG laser, or the like also can be used as the light source.

The projection optical system PL can be a reduction-type system or can have a magnification of unity or can be an enlargement-type system. Furthermore, when a far ultraviolet ray such as an excimer ray is used, the projection optical system PL should be made from a material that transmits a far ultraviolet ray such as quartz and fluorite instead of glass, and when an $F_2$ laser or an X-ray is used, the projection optical system PL should be a dioptric system or a reflection dioptric system (a reflective-type reticle also is used). Furthermore, when using an electron beam, the projection optical system having a deflector and an electron lens can be used. Additionally, needless to say, the optical path in which the electron beam is transmitted needs to be in a vacuum state.

When a linear motor (see, e.g., U.S. Pat. No. 5,623,853 or U.S. Pat. No. 5,528,118) is used for the wafer stage 3 and the reticle stage 2, an air floating type of linear motor using an air bearing or a magnetic floating-type of linear motor using an electromagnetic force (Lorentz force) can be used. Furthermore, the respective stages 2 and 3 can also be a type that moves along a guide or can be a guideless type in which a guide is not arranged on the wafer stage support.

As a driving mechanism of the respective stages 2 and 3, a planar motor can be used that drives the stages 2 and 3 by an electromagnetic force, and that includes a magnet unit (permanent magnet) having magnets arranged in a two-dimensional manner opposite to an armature unit having coils arranged in a two-dimensional manner. In this case, one of the magnet unit and the armature unit is connected to the respective stages 2 and 3, and the other of the magnet unit and armature unit can be arranged in the moving plane side (base) of the respective stages 2 and 3.

An exposure apparatus 1 of embodiments of this invention can be fabricated by assembling various sub-systems including, e.g., a projection optical system, the reticle and wafer stages, the holding plates and the various actuators, so as to maintain predetermined mechanical accuracy, electrical accuracy, and optical accuracy. In order to obtain these accuracies, before and after this assembly, adjustment is performed to accomplish the desired electrical accuracy for the various electrical systems, adjustment is performed to accomplish the desired mechanical accuracy for the various mechanical systems, and adjustment is performed to accomplish the desired optical accuracy for the various optical systems. An assembly process of the various sub-systems to make the exposure apparatus includes mechanical connection, wire connection of electric circuits, tube connection of any pressure circuits, or the like of the various sub-systems. Before an assembly process of the various sub-systems to make the exposure apparatus, an individual assembly process for the respective sub-systems is performed. After the assembly process of the exposure apparatus from the various sub-systems is completed, total adjustment is performed, and various accuracies are assured for the entire exposure apparatus. Furthermore, it is preferable that fabrication of an exposure apparatus is performed in a clean room in which temperature, cleanliness, and the like are precisely controlled.

Figure 8:
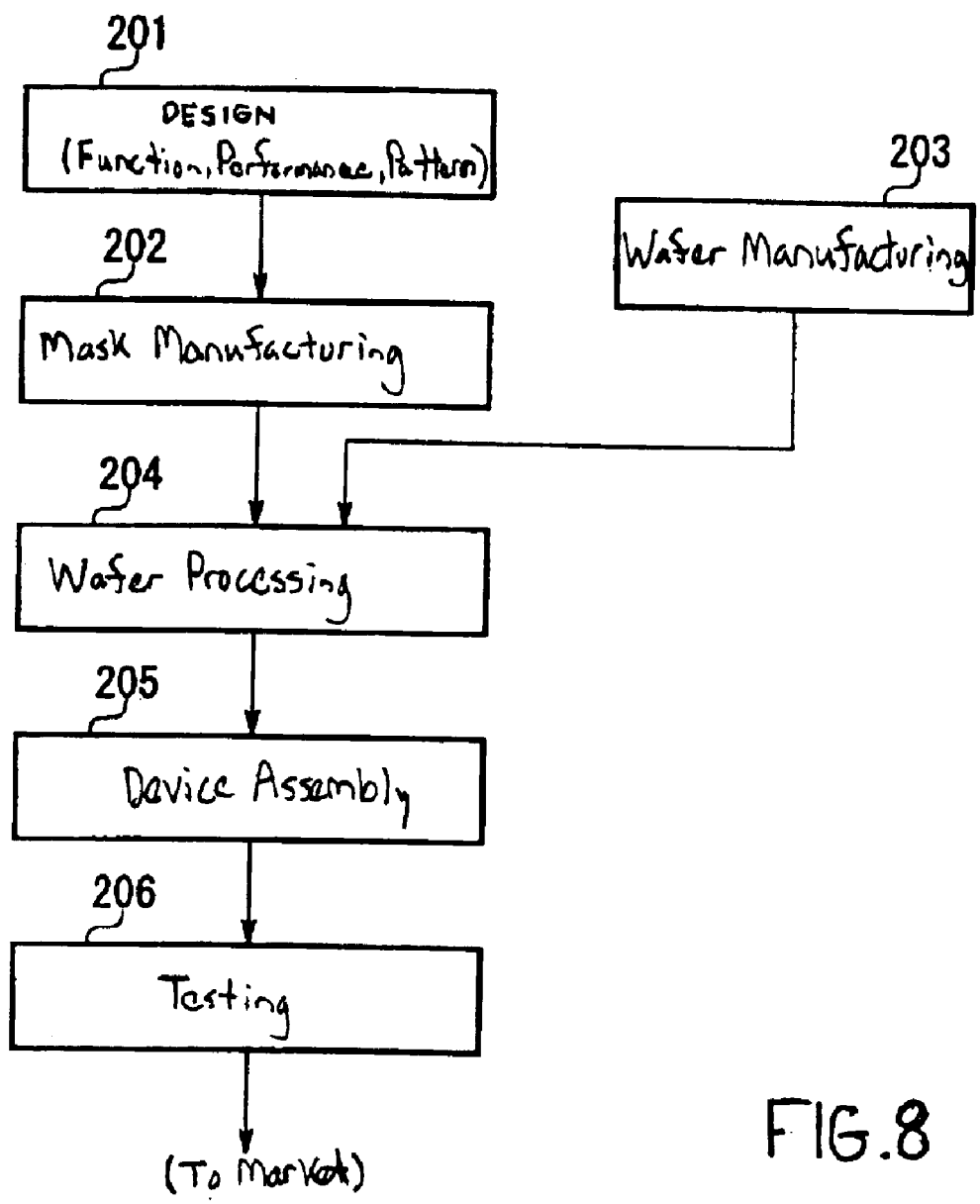
FIG. 8 is a flowchart showing one example of a process of fabricating a semiconductor device.

As shown in FIG. 8, a semiconductor device is fabricated by performing step 201 in which the device is designed based on its desired function and performance, step 202 in which a mask (reticle) is fabricated based on the design step, step 203 in which a wafer is fabricated, e.g., from silicon material, step 204 in which the wafer is processed by exposing a pattern of the reticle onto the wafer by using the exposure apparatus 1 of the above-mentioned embodiments, step 205 in which the device is assembled (this can include a dicing process, a bonding process, and a packaging process), and step 206 in which the device is tested, etc.

As explained above, according to one aspect of the invention, an exposure apparatus includes a detector that detects information concerning displacement of an projection optical system, and a driver that drives an actuator arranged on a holder of the projection optical system in response to a detection result of the detector. Accordingly, in this exposure apparatus, oscillation of the projection optical system due to distortion and contraction/expansion of the holder can be damped. This provides an excellent effect in that deterioration of positioning accuracy and deterioration of pattern projection accuracy due to oscillation of the projection optical system can be prevented, and exposure accuracy corresponding to a fine pattern can be maintained.

According to one preferred embodiment, the actuator has piezoelectric elements. In this exposure apparatus, based on the detection result of the detector, the piezoelectric elements can be expanded and contracted, and oscillation of the projection optical system due to distortion and contraction/expansion of the holder can be damped. At the same time, only the oscillation due to contraction/expansion of the piezoelectric elements is generated, so there is an effect that no other (unnecessary) oscillation is generated in other parts, unlike when the projection optical system is directly driven.

According to a preferred embodiment, the detector is arranged on at least one of the projection optical system and the holder. In this exposure apparatus, information concerning displacement of the projection optical system can be detected via oscillation of the projection optical system or distortion and contraction/expansion of the holder, and if information is detected by detectors provided at both locations, information with higher accuracy can be obtained.

According to one preferred embodiment, the detector is an acceleration sensor. This has an effect in that information concerning displacement of the projection optical system can be obtained via acceleration added to the projection optical system.

According to another preferred embodiment, the detector is a distortion detector. This has an effect in that information concerning displacement of the projection optical system can be obtained through distortion added to the projection optical system.

Preferably the driver has a filter that filters the detection results of the detector. This has an effect in that only displacement of the projection optical system caused by mechanical resonance can be extracted.

According to a preferred embodiment of the invention, the actuator is arranged in the vicinity of the holder. This has an effect in that a location in which distortion and contraction/expansion of the holder can be easily generated can be effectively controlled, the actuator can be made small, and the number of actuators can be minimized.

According to another embodiment of the invention, the actuator is arranged in the vicinity of processed parts of the holder. This has an effect in that a location in which distortion and contraction/expansion of the holder can be easily generated can be effectively controlled, and the actuator can be made small, and the number of actuators can be minimized.

According to a preferred embodiment of the invention, a mask stage, a substrate stage, and a projection optical system can be oscillated independently. In this exposure apparatus, oscillation due to driving of the substrate stage and the mask stage can be prevented from being transmitted to the projection optical system, and generation of shift, image blurring, or the like of the pattern transfer position due to oscillation of the projection optical system can be more effectively prevented, and exposure accuracy can be improved.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. An exposure apparatus that exposes a pattern of a reticle onto a substrate, the exposure apparatus comprising:

a projection system to project the pattern onto the substrate;

a holder connected to the projection system to hold the projection system;

a support member that supports the projection system by the holder;

a stage that holds and moves one of the substrate and the reticle, the stage is not supported by the support member;

a damper that isolates the projection system from the stage;

a detector to detect information concerning displacement of the projection system;

an actuator having a pair of piezoelectric elements coupled to the holder to actuate the holder in a two dimensional plane perpendicular to an axis of the projection system; and a driver connected to the actuator to drive the actuator in response to a detection result of the detector to suppress a strain of the holder resulting from a resonance of the projection system.

2. The exposure apparatus of claim 1, wherein the detector is arranged on at least one of the projection system and the holder.

3. The exposure apparatus of claim 1, wherein the detector includes an acceleration sensor.

4. The exposure apparatus of claim 1, wherein the detector includes a distortion sensor.

5. The exposure apparatus of claim 1, wherein the detector is arranged in a vicinity of the holder.

6. The exposure apparatus of claim 1, wherein the actuator is arranged in a vicinity of a relatively weak part of the holder.

7. The exposure apparatus of claim 1, wherein the detector includes an acceleration sensor mounted to the projection system and a distortion sensor mounted to the holder.

8. The exposure apparatus of claim 1, wherein the actuator is mounted on a plate that is releasably attached to the holder.

9. The exposure apparatus of claim 1, wherein the projection system is a projection optical system.

10. The exposure apparatus of claim 1, wherein the stage is a substrate stage that holds and moves the substrate.

11. The exposure apparatus of claim 10, wherein the exposure apparatus is a scanning exposure apparatus, and the substrate stage moves while the pattern is projected onto the substrate.

12. The exposure apparatus of claim 1, wherein the stage is a reticle stage that holds and moves the reticle.

13. The exposure apparatus of claim 12, wherein the exposure apparatus is a scanning exposure apparatus, and the reticle stage moves while the pattern is projected by the projection system.

14. The exposure apparatus of claim 1, further comprising a reaction system that manages a reaction force exerted by a movement of the stage.

15. The exposure apparatus of claim 1, wherein the holder comprises a kinematic support structure.

16. A method of making an exposure apparatus that exposes a pattern of a reticle onto a substrate, the method comprising:

providing a projection system to project the pattern onto the substrate;

providing a holder connected to the projection system to hold the projection system;

providing a support member that supports the projection system by the holder;

providing a stage that holds and moves one of the substrate and the reticle, the stage is not supported by the support member;

providing a damper that isolates the projection system from the stage;

providing a detector to detect information concerning displacement of the projection system;

providing an actuator having a pair of piezoelectric elements coupled to the holder to actuate the holder in a two dimensional plane perpendicular to an axis of the projection system; and providing a driver connected to the actuator to drive the actuator in response to a detection result of the detector to suppress a strain of the holder resulting from a resonance of the projection system.

17. The method of claim 16, wherein the detector is arranged on at least one of the projection system and the holder.

18. The method of claim 16, wherein the detector includes an acceleration sensor.

19. The method of claim 16, wherein the detector includes a distortion sensor.

20. The method of claim 16, wherein the detector is arranged in a vicinity of the holder.

21. The method of claim 16, wherein the actuator is arranged in a vicinity of a relatively weak part of the holder.

22. The method of claim 16, further comprising mounting the actuator on a plate that is releasably attached to the holder.

23. The method of claim 16, wherein the stage is a substrate stage that holds and moves the substrate.

24. The method of claim 16, wherein the stage is a reticle stage that holds and moves the reticle.

25. The method of claim 16, further comprising:

providing a reaction system that manages a reaction force exerted by a movement of the stage.

26. A method of exposing a pattern of a reticle onto a substrate through a projection system, the method comprising:

holding the projection system with a holder;

supporting the projection system to a support member by the holder;

moving a stage that holds one of the substrate and the reticle, the stage is not supported by the support member;

isolating the projection system from the stage;

detecting information concerning displacement of the projection system; and driving an actuator having a pair of piezoelectric elements coupled to the holder in response to the detected information to suppress a strain of the holder resulting from a resonance of the projection system, the pair of piezoelectric elements actuating the holder in a two dimensional plane perpendicular to an axis of the projection system.

27. The method of claim 26, wherein the information concerning displacement of the projection system is detected by a detector arranged on at least one of the projection system and the holder.

28. The method of claim 26, wherein the information concerning displacement of the projection system is detected by an acceleration sensor.

29. The method of claim 26, wherein the information concerning displacement of the projection system is detected by a distortion sensor.

30. The method of claim 26, wherein the information concerning displacement of the projection system is detected by a detector arranged in a vicinity of the holder.

31. The method of claim 26, wherein the actuator is arranged in a vicinity of a relatively weak part of the holder.

32. The method of claim 26, wherein the actuator is mounted on a plate that is releasably attached to the holder.

33. The method of claim 26, wherein the stage is a substrate stage that holds the substrate.

34. The method of claim 26, wherein the stage is a reticle stage that holds the reticle.

35. The method of claim 26, further comprising:
managing, in a reaction system, a reaction force exerted by a movement of the stage.

36. An exposure apparatus that exposes a pattern of a reticle onto a substrate, the exposure apparatus comprising:
a projection system to project the pattern onto the substrate;
a support member to support the projection system through a flange of the projection system;
a stage that holds and moves one of the substrate and the reticle, the stage is not supported by the support member;
a damper that isolates the projection system from the stage;
a detector to detect information concerning displacement of the projection system;
an actuator coupled to the flange; and
a driver connected to the actuator to drive the actuator in response to a detection result of the detector to suppress an influence of resonance of the projection system.

37. The exposure apparatus of claim 36, wherein the driver suppresses a strain of the support member.

38. The exposure apparatus of claim 36, wherein the actuator includes piezoelectric elements.

39. The exposure apparatus of claim 36, wherein the detector is arranged on at least one of the projection system and the support member.

40. The exposure apparatus of claim 36, wherein the detector includes an acceleration sensor.

41. The exposure apparatus of claim 36, wherein the detector includes a distortion sensor.

42. The exposure apparatus of claim 36, wherein the stage is a substrate stage that holds and moves the substrate.

43. The exposure apparatus of claim 36, wherein the stage is a reticle stage that holds and moves the reticle.

44. The exposure apparatus of claim 36, wherein the actuator is located beneath a lower surface of the flange.

45. An exposure apparatus that exposes a pattern onto a substrate, the exposure apparatus comprising:

a projection system that projects the pattern onto the substrate, and that has a flange;
a support member that supports the projection system through the flange of the projection system;
a plate coupled to the flange;
a pair of piezoelectric elements coupled to the plate; and
a driver connected to the pair of piezoelectric elements to suppress a vibration of the projection system.

46. The exposure apparatus of claim 45, wherein the pair of piezoelectric elements is arranged in a vicinity of a relatively weak part of the flange.

47. The exposure apparatus of claim 45, wherein the plate is arranged on an upper surface of the flange.

48. The exposure apparatus of claim 45, wherein the pair of piezoelectric elements is coupled to the plate by an adhesive.

49. The exposure apparatus of claim 45, wherein the support member comprises a kinematic support structure.

50. The exposure apparatus of claim 45, wherein the driver comprises an amplifier.

51. The exposure apparatus of claim 45, further comprising a detector to detect information concerning displacement of the projection system.

52. The exposure apparatus of claim 51, wherein the detector is attached near a top of the projection system.

53. An exposure apparatus that exposes a pattern onto a substrate, the exposure apparatus comprising:
a projection system that projects the pattern onto the substrate;
a support member that supports the projection system, the support member having at least one of: (i) a plurality of hole members and (ii) a plurality of notch members;
a pair of piezoelectric elements coupled to the support member and that are actuatable in a two dimensional plane perpendicular to an axis of the projection system; and
a driver connected to the pair of piezoelectric elements to actuate the pair of piezoelectric elements to suppress a vibration of the projection system.

54. The exposure apparatus of claim 53, wherein the support member comprises a kinematic support structure.

55. The exposure apparatus of claim 53, wherein the driver comprises an amplifier.

56. The exposure apparatus of claim 53, further comprising a detector to detect information concerning displacement of the projection system.

57. The exposure apparatus of claim 56, wherein the detector is attached near a top of the projection system.

* * * * *